United States Patent [19]
Roth

[11] Patent Number: 5,201,184
[45] Date of Patent: Apr. 13, 1993

[54] METHOD AND APPARATUS FOR PRECOOLING THE HELIUM TANK OF A CRYOSTAT

[75] Inventor: Gerhard Roth, Karlsruhe, Fed. Rep. of Germany

[73] Assignee: Bruker Analytische Messtechnik GmbH, Fed. Rep. of Germany

[21] Appl. No.: 709,098

[22] Filed: May 29, 1991

[30] Foreign Application Priority Data

May 29, 1990 [DE] Fed. Rep. of Germany ....... 4017213

[51] Int. Cl.$^5$ .............................................. F17C 5/02
[52] U.S. Cl. ...................................... 62/47.1; 62/50.2; 62/51.1
[58] Field of Search .................. 62/47.1, 50.2, 51.1, 62/55.5

[56] References Cited

U.S. PATENT DOCUMENTS

| | | | |
|---|---|---|---|
| 1,941,304 | 12/1933 | Heylandt | 62/50.7 |
| 2,247,850 | 7/1941 | Rayburn | 62/51.1 |
| 2,702,460 | 2/1955 | Gaugler | 62/527 |
| 3,371,499 | 3/1968 | Hagenbach et al. | 62/55.5 |
| 3,720,072 | 3/1973 | Berta et al. | 62/47.1 |
| 3,769,806 | 11/1973 | Boissin et al. | 62/55.5 |
| 4,223,540 | 9/1980 | Longsworth | 62/51.1 |
| 4,510,771 | 4/1985 | Matsuda et al. | 62/51.1 |

FOREIGN PATENT DOCUMENTS 2906060  3/1979  Fed. Rep. of Germany .
3724562  7/1987  Fed. Rep. of Germany .

Primary Examiner—Ronald C. Capossela
Attorney, Agent, or Firm—Walter A. Hackler

[57] ABSTRACT

In a method and an apparatus for the precooling of a helium tank of a cryostat, in particular an optical cryostat with optical components in the helium tank, or an NMR cryostat, or a medical NMR cryostat for magnet resonance imaging, which accepts a superconducting magnet coil, a simple and cost effective precooling is achieved in that liquid nitrogen is directed out of a storage container under small overpressure via a conduit through an opening in the helium tank of a cryostat into a heat exchanger arranged in the helium tank and therefrom, by way of an opening, out of the cryostat and, finally, into a collecting container, in particular, into a nitrogen tank surrounding the helium tank.

17 Claims, 2 Drawing Sheets

METHOD AND APPARATUS FOR PRECOOLING THE HELIUM TANK OF A CRYOSTAT

BACKGROUND OF THE INVENTION

The invention concerns a method and an apparatus for precooling the helium tank of a cryostat, in particular, an optical cryostat with optical components in the helium tank, an NMR cryostat, or a medical NMR cryostat for magnetic resonance imaging which accepts a superconducting coil.

Cryostats which can accept a superconducting magnetic coil are, by way of example, known in the art from the area of nuclear resonance spectroscopy or magnetic resonance imaging (DE-OS 29 06 060, DE-PS 37 24 562). These cryostats exhibit a plurality of containers or tanks which are nested within each other and the innermost one contains a magnetic coil which, during operation, is filled with liquid helium at a temperature of approximately 4 K. An outer tank contains fluid nitrogen with a temperature of approximately 77 K. Both tanks are vacuum isolated with respect to each other and with respect to room temperature, whereby the evacuated intermediate space contains radiation shields at intermediate temperatures so that both the heat transport as well as the heat radiation is minimized. Before the initial operation or following a maintenance or repair on the magnetic coil or on the cryostat, said cryostat must be cooled down to the operating temperature. Many prodecures are known in the art by which the cryostat can be cooled down to the operating temperature. One procedure proposes filling the nitrogen tank with fluid nitrogen and the helium tank with fluid helium, and to cool down in this manner. Towards this end, however, large quantities of fluid helium are necessary since the magnetic coil and the inner space of the cryostat must be cooled down with the fluid helium only. The liquid helium, despite its low temperature of 4 K, exhibits only a small capacity for heat absorption compared to that of liquid nitrogen at a temperature of 77 K. In consequence, in addition to the large quantity of fluid helium used which, in addition, is very expensive, there is a sizeable time expense due to the small heat absorption capability. These disadvantages are, furthermore, not justified by the requirement that the helium tank come solely in contact with the helium cooling medium in order to avoid impurities, in particular, when the tank contains elements with large heat capacities, for example, a superconducting magnet coil.

Another method proposes venting the evacuated intermediate space between the nitrogen and helium tanks by means of dry nitrogen gas so that the helium tank can be cooled down to the temperature of 77 K via a heat conduction. This procedure has, however, the disadvantage that the nitrogen must then be removed from the evacuated intermediate space. Since, in general, this can only be partially achieved, the remaining nitrogen freezes onto the cooled helium tank when the cryostat is later put into operation. Furthermore, there are possible vacuum valve operational faults which present, in turn, safety risks, since there is the danger of an explosion as a result of the overpressure coming from the evaporating condensed nitrogen or air. Moreover, this indirect cooling by way of the intermediate evacuated space between the nitrogen tank and the helium tank is ineffective, time consuming, and in addition, in the event of one single interconnected intermediate vacuum space between the nitrogen tank and the helium tank on the one hand and the ambient environment on the other hand, leads to an icing of the outer jacket of the cryostat.

Another and the most common method is to initially fill the helium tank with liquid nitrogen, whereby the tank is cooled down to a temperature of 77 K. In consequence of this cooling down, most of the total heat is removed from the cryostat. However, the liquid nitrogen must then be completely removed from the helium tank following the cooling down procedure. Remaining quantities of nitrogen cause reduction in the helium storage time, which, with NMR magnets, corresponds generally to one year, and, in particular, remaining quantities of nitrogen on the magnet coil cause a reduction in the operating safety of the magnet coil, that is to say, an increased risk of a quench, that is to say, an unintentional transition from the superconducting to the normally conducting state of the magnet coil. Furthermore, with optical cryostats, there is the danger that optical components such as windows, mirrors or other optical elements, become coated with frozen nitrogen. If the nitrogen exhibits a certain fraction of oxygen, that is to say is contaminated with oxygen, then this paramagnetic component will be attracted to the magnet coil during operation. Furthermore, there is the additional increased danger that in consequence of the disassembly needed during the filling procedure or the exchange of two liquid gases, that ambient air and, thereby, moisture can condense, which, in turn, can lead to operational failures and reduce the storage time of the helium. Furthermore, there is an increased safety risk associated with operational error.

The positioning of an additional nitrogen tank on the outside of the helium tank which coaxially surrounds the helium tank is also known in the art of cryostats. In this arrangement the nitrogen tank can then be filled with fluid nitrogen, whereby, the wall of the helium tank and thereby the inside of the helium tank are gradually cooled down. This method exhibits, however, the disadvantage that, within the helium tank, an insufficient amount of convection of the helium gas within the helium tank is produced due to the symmetric arrangement of the nitrogen tank around the helium tank. This symmetric arrangement is, however, essential for an even weight distribution of the tank in the cryostat. Furthermore, there is an additional substantial disadvantage in that the entire volume taken in by this nitrogen tank does not contribute to the cooling during the subsequent steady state operation of the cryostat. Even if the entire nitrogen were removed from the tank after precooling of the cryostat and this tank then filled with helium, the helium would not contribute to the cooling of the superconducting magnet, since, the helium in this tank is confined and cannot contribute to the convection and heat transfer in the actual helium tank of the cryostat.

One can therefore in general conclude that, with the cryostat configured in this manner, the space within the cryostat is not optimally utilized.

Therefore, an object of the invention is to provide a method and/or an apparatus for the precooling of a helium tank of a cryostat in which the above mentioned disadvantages are avoided.

SUMMARY OF THE INVENTION

This object is achieved by means of a method in that liquid nitrogen is directed out of a storage container under small pressure via a conduit through an access opening of the helium tank of a cryostat into a heat exchanger configured in the helium tank, then, via an access opening, out of the cryostat and finally into a collecting container, in particular, into the nitrogen tank surrounding the helium tank. The access openings in the helium tank are in general configured as towers. For reasons of simplicity, the terminology towers will be used in subsequent discussion.

In the method according to the invention, the helium tank of the cryostat, which is filled with helium gas and under atmospheric pressure, is cooled down with liquid nitrogen which, in turn, exhibits a temperature of approximately 77 K. The liquid nitrogen is introduced via a conduit into the helium tank and removes heat from the helium gas located in the helium tank by means of a heat exchanger and directs that heat out of the helium tank via the streaming nitrogen. Due to the large heat capacity of the liquid nitrogen, large quantities of heat can be removed from the helium tank using small amounts of nitrogen. Thereby, it is advantageous when the heat exchanger exhibits a relatively small volume so that it is arrangeable practically anywhere within the helium tank. Finally, this method has the significant advantage that the inside of the helium tank comes only in contact with helium and is, therefore, contaminated neither by nitrogen nor by other gases. Since, with this method, only helium gas is located in the helium tank and the nitrogen in the helium tank is introduced within a closed conduit, it is not necessary to clean the helium tank after it has been cooled to a temperature in the range of 100 K, rather, it can immediately thereafter be filled with liquid helium. In order to cool the helium tank and the magnetic coil located within the helium tank to a temperature of 4 K from a temperature of approximately 100 K it is then therefore necessary to use a substantially less amount of liquid helium, since the majority of the total heat of the cryostat has already been removed through the cooling of the liquid nitrogen flowing through the heat exchanger to a temperature of about 100 K. With this method the consumption of helium is likewise minimized. This method according to the invention therefore offers the advantage of a cost effective and operationally reliable precooling of the helium tank of the cryostat. It combines the advantage of cooling from room temperature to a temperature in the range of 100 K via nitrogen with the advantage that the helium tank and thereby the magnetic coil located within the tank or optical components only come in contact with helium and are not contaminated.

It is preferred when the nitrogen is introduced and removed by way of the same tower in the helium tank. This has the advantage that the method can also be used with cryostats exhibiting a single tower. With cryostats exhibiting a plurality of towers, this method offers the advantage that the other towers can be used for other purposes.

It is preferred when the pressure in the nitrogen storage container is utilized for the transport of the nitrogen. When the stop valve of the nitrogen storage container is opened, the nitrogen streams out of the storage container via the conduit through the heat exchanger and therefrom into the other container connected following the heat exchanger.

The nitrogen tank is precooled by the cold nitrogen gas leaving the heat exchanger. After a certain time liquid nitrogen, in general, a gas-fluid mixture, also flows out of the heat exchanger and into the nitrogen tank This tank is then filled. Optimally, the helium tank with all its components then has a temperature of approximately 100 K when the nitrogen tank is exactly filled up. Advantageously, the flow velocity of the nitrogen is so chosen. Since the nitrogen is fed into the nitrogen tank surrounding the helium tank of the cryostat, a further advantage results in that this nitrogen tank, due to its reduced heat capacity compared to that of the magnet coil in the helium tank, cools faster than the helium tank and, thereby, impurities in the vacuum portion condense on the nitrogen tank and not on the helium tank.

Preferably, the heat exchanger and its associated feed and exit conduits are flushed of nitrogen after completion of the precooling of the helium tank. This has the advantage that the feed and exit conduits can be disconnected from the heat exchanger and removed from the cryostat without contaminating the inner region of the helium tank with nitrogen. The heat exchanger can remain in the inside of the helium tank, that is to say, it must not be removed from the cryostat after precooling. When fluid helium is introduced into the helium tank after precooling, said liquid helium floods the heat exchanger, but the heat exchanger in the helium tank presents insignificant interference since its volume is relatively small.

In a further method, the heat exchanger is removed from the helium tank after precooling of the helium tank. This has the advantage that the heat exchanger can be utilized to precool other cryostats, that is to say, this heat exchanger is not lost, and the nitrogen precooling circuit remains absolutely decoupled from the helium tank.

The above mentioned object is achieved in accordance with the invention by means of the apparatus in that a heat exchanger arranged within the helium tank of the cryostat exhibits a liquid nitrogen lead pipe and a plurality of cooling fins. Since the nitrogen within the heat exchanger is guided within a pipe and since this pipe is surrounded with a plurality of cooling fins, one achieves the advantage that, with respect to the amount of nitrogen located in the helium container during the precooling, the cooling surface of the heat exchanger is extremely large. In this manner, the heat exchanger is capable of removing large quantities of heat from the helium gas and transfering said heat to the nitrogen.

In a preferred embodiment, the heat exchanger is connected to the nitrogen storage container at one end and, at the other end, to a collecting container. Hereby, it is preferred when the nitrogen tank surrounding the helium tank of the cryostat serves as the collecting container. This has the advantage that the nitrogen container is simultaneously filled while the helium tank is being precooled or, conversely, when the nitrogen container is being filled for the first time, the helium tank is being simultaneously precooled.

It is preferred when the feed and exit conduits of the heat exchanger are configured as double pipes, as coaxial, or as a pipe divided by means of a lengthwise wall. In this double pipe the nitrogen can then be introduced to and removed from the heat exchanger located in the helium tank by means of a single tower. It is advantageous when the double pipe can be simply positioned from the outside onto the heat exchanger in a sealable and disconnectable manner. Furthermore, the effective free cross section of the tower is thereby completely taken advantage of for the introduction and removal of the nitrogen.

A strong convection of the helium gas within the helium tank is achieved in that the heat exchanger is arranged above the magnet and, in particular, is configured with a partial circular shape. In this configuration and form of the heat exchanger one causes the cooled helium gas to fall down across the heat exchanger and thereby along the magnet. In this manner the cooled helium gas effectively removes heat from the magnet, sweeps upward over the other side of the magnet before returning to the heat exchanger in a warmed up state. By configuring the heat exchanger on only one side of the magnet, a circulation of helium gas is driven within the cryostat, which is directed downwards on the side of the heat exchanger and upwards around the magnet on the opposite side.

It is preferred when the helium atmosphere located in the helium tank convectively streams around all sides of the heat exchanger. This has the advantage that the heat exchanger can be equipped with cooling fins on all of its sides which then, together, are surrounded with helium gas and can remove heat therefrom. In this manner, a relatively large heat exchange surface is achieved without increasing the amount of nitrogen streaming through the heat exchanger.

Preferably, the heat exchanger exhibits a separation from the wall of the helium tank. In this embodiment, care is taken that the wall of the helium tank does not negatively influence the convection.

An improvement envisions that the heat exchanger is configured as a retrofitable element. In this way, existing cryostats can be equipped with a heat exchanger so that, at the next occasion, these cryostats can be cooled down by means of the precooling method according to the invention.

In order to increase the turbulence of the nitrogen streaming in the pipe of the heat exchanger and, thereby, the heat transport from the inner walls of the pipe onto the nitrogen, it is, advantageously, envisioned that the heat exchanger pipe which guides the nitrogen exhibits a mesh insert with good heat conductivity, for example, from copper, turbulence insert, or the like. This mesh insert serves to prevent the nitrogen vapour accumulation on the walls of the pipe from interfering with the heat transport from the pipe wall.

It is advantageous when the heat exchanger, in particular when the coupling between the feed and exit conduits and the heat exchanger, is heatable. In this manner, the icing on the heat exchanger or the like can be removed. In particular, with flexible heat exchangers, the flexibility can be restored.

In a preferred embodiment it is provided for that the heat exchanger is so configured that it is removable from the helium tank, in particular, without having to decouple the feed and exit conduits. This has the advantage that the heat exchanger can be utilized for a plurality of precoolings of cryostats and that there is no dead space in the cryostat itself. This allows a complete separation of the precooling circuit from the helium tank.

This heat exchanger can, preferentially, be configured in such a way that it exhibits fan like or umbrella like cooling fins which can be folded out or swivelled. The folding out or swivelling of the cooling fins transpires after the heat exchanger is introduced to the position in the cryostat which has been provided for. After cool down the cooling fins are folded together before removal of the heat exchanger so that the heat exchanger can be pulled out through the tower.

In a heat exchanger with umbrella like fold-out cooling fins, the umbrella tip forms the upper end and the fold-out ends of the cooling fins the under end of the heat exchanger which, in this manner, with folded in cooling fins, the heat exchanger can be introduced into the helium tank through one of its towers and opened up between the wall of the helium tank and the outer surrounding wall of the magnet in the region above the magnet or above its middle position. It is advantageous if this umbrella-like configuration of the heat exchanger can exhibit an opening mechanism on its under end which is activated when the introduced heat exchanger reaches the bottom of the helium tank, whereby the opening mechanism disengages arresting devices so that, by way of example, the umbrella opens by spring action. A removal of a heat exchanger configured in this manner is possible in a simple fashion in that, during removal of the heat exchanger from the cryostat, in consequence of the narrow opening cross section of the tower, the umbrella folds or lays itself together. In addition to increased surface area, this type of heat exchanger exhibits the advantage that it can be used many times and that no dead space remains in the helium tank.

Advantageously, the cooling fins are spring extendable. In this configuration, no special measures are required to open up the cooling fins after introducing the heat exchanger into the inside of the helium container. When removing the heat exchanger, the cooling fins are pressed together against the spring force or folded together so that the heat exchanger can be pulled out through the relatively small opening of the tower.

An increase in the heat transport from the helium gas to the cooling fins is, advantageously, achieved in that the cooling fins are arranged at an angle to the convecting helium gas stream, in particular, partially interlaced. In this manner, the helium gas is deflected by the cooling fins while streaming by the heat exchanger and, thereby, comes in intimate contact with the cooling fins and is cooled down.

Advantageously, the heat exchanger exhibits a ratio of cooling surface to incorporated nitrogen volume of 0,5 to 5 $m^2/l$, in particular 2 $m^2/l$. In this embodiment it is particularly clear that, with a lost heat exchanger, that is to say with a heat exchanger which remains in the cryostat after precooling of the helium tank, the dead volume is relatively small, although the heat transfer surface of the heat exchanger is large.

In a preferred embodiment the cooling surface is 0,2 $m^2$ and the volume of the nitrogen in the heat exchanger 0,1 l.

After precooling, the liquid nitrogen which possibly still remains in the heat exchanger is, through flushing with helium gas, removed in a manner which is much more reliable than might possibly have been effected in the separate large volume tank utilized by prior art.

BRIEF DESCRIPTION OF THE DRAWINGS

Further characteristic features, advantages and details of the invention can be derived from the following description in which preferred embodiments are described in detail in reference to the drawings. Clearly, the invention is not limited to the embodiment and the characterized features which have been mentioned can be utilized by themselves and in any combination without departing from the framework of the invention. Shown in the drawings are.

DESCRIPTION OF THE PREFERRED EMBODIMENTS

Figure 1:
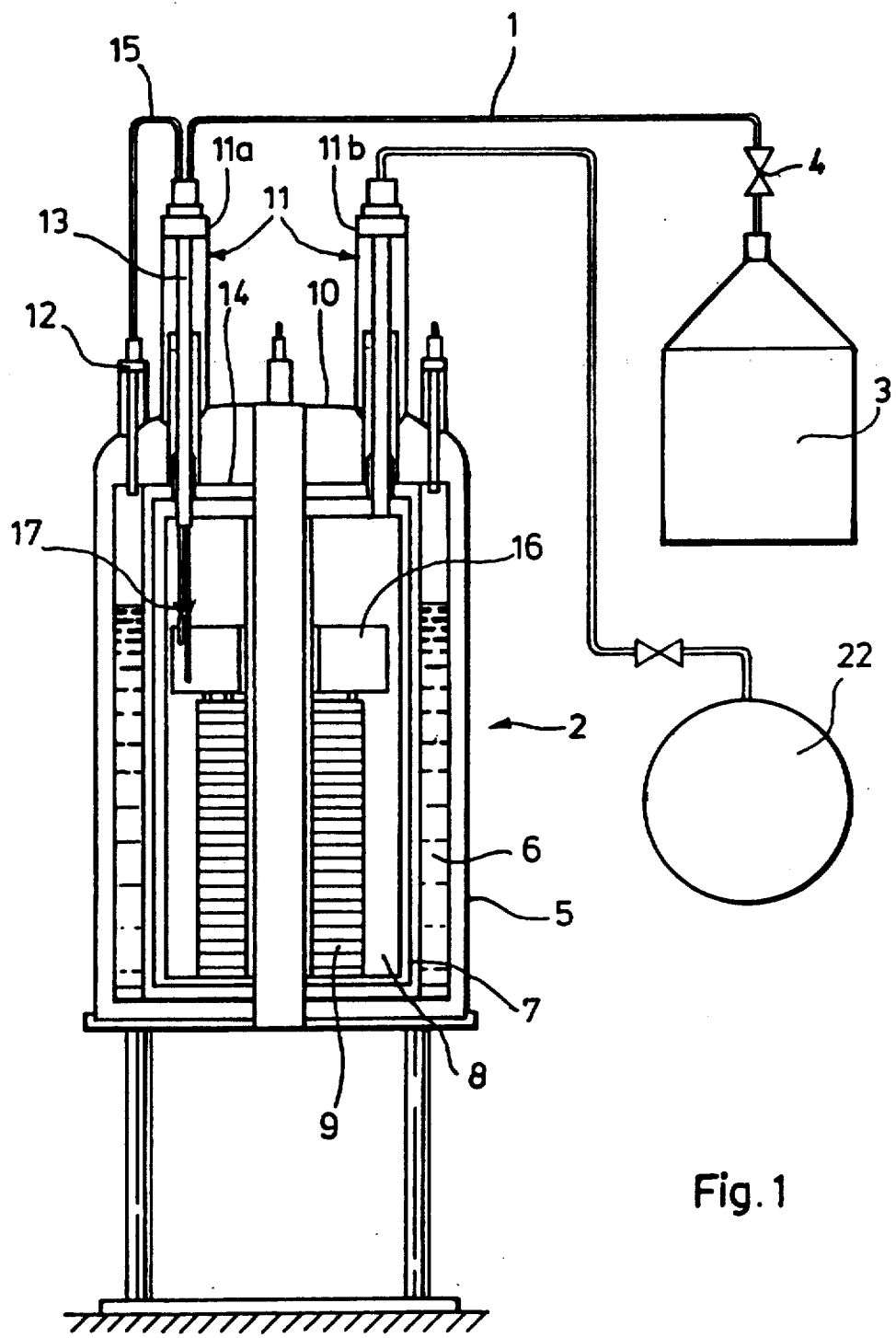
FIG. 1 A sketch of principal operation of the cryostat which is to be precooled.

In the sketch of the operation principal shown in FIG. 1, a cryostat labelled with 2 and a nitrogen storage container 3 are connected to each other via a heat insulated pipe conduit 1. A stop element labelled 4 with a pressure reducer is located immediately connected to the nitrogen container 3 which, by way of example, is configured as a pressure vessel, said stop element being precisely regulatable with regard to the amount of liquid nitrogen streaming out of the nitrogen storage container 3. The cryostat 2 exhibits, within an outer jacket 5, as viewed from the outside towards the inside, a nitrogen tank 6, a radiation shield 7, a helium tank 8, and a coil body 9 located within the helium tank 8 which, in particular, is a superconducting magnet coil. The cryostat is equipped with entrance openings 11 on the upper side 10 in which the individual tanks 6 and 7 as well as shields, for example the radiation shield 7, are suspended. Furthermore a filling support 12 with which the nitrogen tank 6 can be filled is located on the upper side 10. Entrance opening 11 configured as tower 11a exhibits an opening 13 which penetrates through the outer jacket 5, a nitrogen radiation shield 14, and the radiation shield 7 and leads into the helium tank 8.

Another pipe conduit 15 can be seen in FIG. 1 which leads out of the tower 11i a and is connected to the filling supports 12. The two pipe conduits 1 and 15 penetrate through the tower 11a by way of the through opening 13 and project into the helium tank 8 where they are connected to a heat exchanger 16 arranged within helium tank 8. In the schematic representation of FIG. 1, the heat exchanger 16 is not presented to scale, rather, is pictured with exaggerated dimensioning so that the principal of the invention is more clearly represented. This heat exchanger 16 is represented in two preferred embodiments in the FIGS. 2 and 3 and is further explained below. The two pipe conduits 1 and 15 exhibit a coupling 17 in proximity to the heat exchanger 16 by means of which said pipes are connectable to the heat exchanger 16. In this manner the pipe conduit 1 constitutes the feed conduit for the heat exchanger 16 and the pipe conduit 15 the exit conduit, whereby the two conduits 1 and 15 must not necessarily be fed through the same tower 11a into the innards of the helium tank 8. The tower 11a is connected to a helium storage vessel 22 via a conduit and a safety valve. The helium tank 8 always has a small overpressure, in particular, during the phase where it is temporarily opened to the outside. During the precooling phase, the helium gas streams without hindrance from the storage vessel 22 into the helium tank 8.

Figure 2:
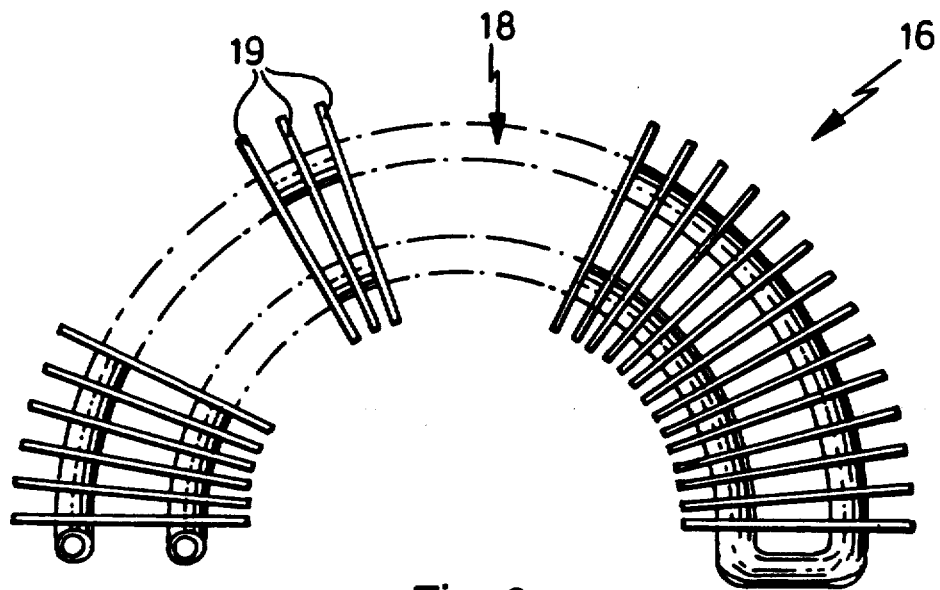
FIG. 2 A first embodiment of the heat exchanger.

The embodiment of a heat exchanger 16 represented in FIG. 2 is configured as a plate heat exchanger and exhibits a cooling hose pipe 18 which penetrates through ray-like or radially arranged cooling fins or cooling plates 19. In this embodiment, the inlet and the outlet of the heat exchanger 16 are provided for at the ends of the heat exchanger 16, whereby in other embodiment types the one end could be the inlet and the other end the outlet. In this embodiment, the plates 19 are penetrated only once by the cooling hose pipe 18. The number of cooling fins 19 Can preferentially be chosen in such a way that the heat exchanger 16 exhibits the necessary heat exchanging surface. The heat exchanger 16 represented in FIG. 2 exhibits largely a half circular form and is accordingly arranged above the coil body 9 on one side of this coil body. This has the substantial advantage that the helium atmosphere cooled by the heat exchanger 16 in the region of the heat exchanger descends downwards along the outer circumference surface of the coil body and thereby is able to remove heat from the coil body 9. Correspondingly, the warm helium atmosphere located on the opposite side of the coil body 9 rises upwards and reaches into the region of the heat exchanger 16 which, in turn, is able to remove the heat of the coil body 9 taken up by the helium. The convection excited in this manner effects and even cooling of the coil body 9 which, due to this careful handling, does not result in any stresses from large temperature gradients which unavoidably occurs in direct precooling of the helium tank 8 using liquid nitrogen.

Figure 3:
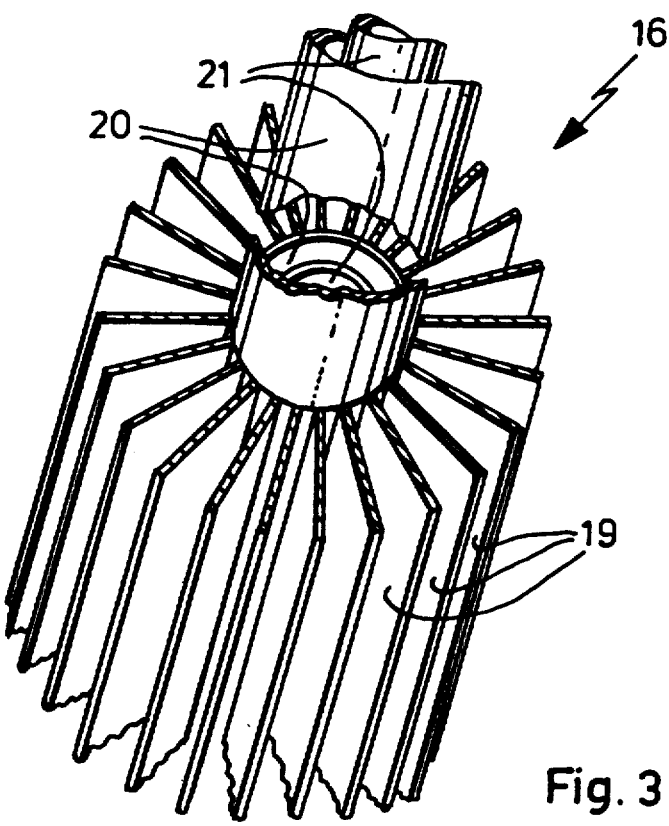
FIG. 3 A second embodiment of the heat exchanger in a perspective view.

The heat exchanger 16 represented in FIG. 3 concerns a movable heat exchanger which can be introduced into the helium tank 8 via the opening 13 in the tower 11a or the tower 11b and, following the precooling procedure, is removable from the cryostat 2. Accordingly, this heat exchanger 16 exhibits a maximum diameter which is so dimensioned that it can be passed through the opening 13 of the tower 11a or 11b. In this manner, the feed conduit 20 and the exit conduit 21 form the core of the heat exchanger 16, whereby the exit conduit 21 is arranged within the feed conduit 20 or vice versa, that is to say, the core is configured as a double pipe. Ray like or radially arranged cooling fins 19 are attached to the outer wall of the inlet conduit 20, whereby the total number of cooling fins 19 determines the entire heat exchanging surface. A heat exchanger configured in this manner exhibits the advantage that it can be used a plurality of times and that, by way of example, more than one heat exchanger 16 can be instituted for the precooling of the cryostat 2. This heat exchanger 16 has the substantial advantage that the nitrogen circulation is absolutely sealed and closed in that no coupling connection for inlet and exit conduits is necessary.

The precooling procedure for the cryostat is explained below. After attaching the nitrogen container 3 via the pipe conduit 1 to the heat exchanger 16 and connecting the heat exchanger 16 via the pipe conduit 15 to the filling support 12 for the nitrogen tank 6, the stop element is opened and the pressure reducer 4 is adjusted in such a manner that the nitrogen from the storage container 3 streams with low velocity via the pipe conduit 1 into the heat exchanger 16. In this manner, the cooling fins 19 of the heat exchanger 16 are cooled via the cooling hose pipe 18 which, in turn, as described above, cools the helium atmosphere located in the helium tank 8. The warmed nitrogen then, via the pipe conduit 15, streams into and flows through the nitrogen container 6 of the cryostat 2. In this manner the nitrogen tank 6 is cooled, in an advantageous fashion, more quickly than the helium tank 8, since the mass located in the helium tank 8 of the coil body 9 cools substantially slower than the mass of the nitrogen tank 6.

As has already been described above, a convection stream of helium atmosphere in helium tank 8 is produced by means of which the cooling body 9 is carefully and evenly cooled down. At the beginning of the precooling procedure liquid nitrogen streams into and cools the helium tank 8. Thereby, the nitrogen vaporizes and exits the helium tank via the outlet conduit of the heat exchanger 16 in a gaseous state. The nitrogen gas then streams into and cools the nitrogen tank 6. Through the gradual cooling down of the helium tank 8 the nitrogen no longer completely vaporizes so that a gas-liquid mixture exits from the heat exchanger 16. The flow velocity of the nitrogen is thereby so chosen that, when the nitrogen tank 6 is full, the helium tank 8 is precooled to a temperature of approximately 100 K.

When the precooling procedure is ended, the two pipe conduits 1 and 15 are separated from the nitrogen storage container 3 and from the fill supports 12, and the nitrogen located in the pipe conduits 1 and 15 and in the heat exchanger 16 is flushed out via a flushing out procedure. Finally, helium gas is introduced into the pipe conduits 1 and 15 and into the heat exchanger 16. In this manner, the inlet and exit conduits which penetrate the towers 11a or 11b through the opening 13 are separated from the heat exchanger 16 and the coupling 17 and are removed from the cryostat 2. Thereby one should emphasize that the helium tank 8 is under slight overpressure, that is to say, there is no danger that ambient air can penetrate in. The cryostat 2 is then ready for the helium tank 8 to be filled up with liquid helium. Thereby, the heat exchanger 16 is also filled with helium which, however, is not disadvantageous since, due to the small volume of the cooling hose pipe 18 and the cooling fins 19, the dead volume formed by the heat exchanger 16 within the helium tank 8 is negligibly small.

With a heat exchanger 16 which is removable from the helium tank 8, said heat exchanger 16 is removed from the cryostat 2 after the precooling procedure and the tank 8 can immediately be filled with liquid helium. It may be necessary to fold in extended the umbrellalike or fan like cooling fins prior to removal of the heat exchanger 16.

The reference numerals in the patent claims are not a restriction but shall facilitate understanding.

I claim:

1. Method for precooling a helium tank of a cryostat comprising the steps of:
   feeding liquid nitrogen from a storage container under low overpressure via a conduit through an opening to the helium tank of the cryostat and into a heat exchanger disposed in the helium tank prior to filling of the helium tank with liquid helium; and
   thereafter feeding the liquid nitrogen, via an opening, out of the helium tank and into a nitrogen collecting container surrounding the helium tank before filling the helium tank with liquid helium.

2. Method according to claim 1 wherein the nitrogen is fed into and removed from the helium tank via a single entrance opening.

3. Method according to claim 1, wherein the pressure in the nitrogen storage container is utilized to transport the nitrogen.

4. Method according to claim 1 wherein the current flow velocity of the nitrogen is selected in order that the helium tank exhibits a precooling temperature of about 100 K when the nitrogen collecting container is just filled up by the liquid nitrogen exiting from the heat exchanger.

5. A cryostat comprising:
   a nitrogen tank;
   a helium tank disposed within said nitrogen tank;
   entrance opening means, in an upper side of the cryostat, for enabling access to the nitrogen and helium tank; and
   heat exchanger means, configured for connection to a nitrogen storage container and to a collecting container, for precooling the helium tank by passing nitrogen therethrough from the nitrogen storage container and into the collecting container.

6. The cryostat according to claim 5 wherein the collecting container comprises the nitrogen tank surrounding the helium tank of the cryostat.

7. The cryostat according to claim 5 further comprising inlet and exit conduit means for introducing and removing liquid nitrogen to and from the heat exchanger said inlet and exit conduit means being configured as coaxial double pipes.

8. The cryostat according to claims 7 wherein the inlet and outlet conduit means for the heat exchanger means comprises a pipe with a lengthwise running intermediate wall, the lengthwise wall separating inlet and outlet conduits from each other.

9. The cryostat according to claim 8 further comprising mesh insert means disposed in said heat exchanger means for preventing nitrogen vapor accumulation on the pipe wall.

10. The cryostat according to claim 7 wherein the inlet and outlet means is configured for decoupling from the heat exchanger means and sized for removal from the cryostat entrance opening means.

11. The cryostat according to claim 5 further comprising a superconductive magnet coil disposed in said helium tank and wherein the heat exchanger means is disposed above the magnet and is configured as partially circular.

12. The cryostat according to claim 5 wherein the heat exchanger means is disposed in the helium tank in a position where helium atmosphere located in the helium tank convectively streams around all sides of the heat exchanger means.

13. The cryostat according to claim 12 wherein the heat exchanger means is configured for collapsing and removal from the helium tank through the entrance opening means.

14. The cryostat according to claim 13 wherein the heat exchanger means includes fan or umbrella-like cooling fins which can be folded out or swivelled.

15. The cryostat according to claim 14 wherein the cooling fins are configured as spring extendible.

16. The cryostat according to claim 14 wherein the cooling fins are disposed at a position for providing heat exchanging surfaces to the convecting helium gas stream.

17. The cryostat according to claim 5 wherein the heat exchanger means is disposed in a spaced apart relationship with the walls of the helium tank.

* * * * *